United States Patent
Iino

(10) Patent No.: US 6,174,363 B1
(45) Date of Patent: Jan. 16, 2001

(54) METHOD FOR PRODUCING SILICON SINGLE CRYSTAL

(75) Inventor: Eiichi Iino, Gunma-ken (JP)

(73) Assignee: Shin-Etsu Handotai Co., Ltd., Tokyo (JP)

(*) Notice: Under 35 U.S.C. 154(b), the term of this patent shall be extended for 0 days.

(21) Appl. No.: 09/281,704

(22) Filed: Mar. 30, 1999

(30) Foreign Application Priority Data

Apr. 7, 1998 (JP) .................................................. 10-111411

(51) Int. Cl.$^7$ .................................................. C30B 15/20
(52) U.S. Cl. .................................................. 117/13
(58) Field of Search .............................. 117/13, 217, 911

(56) References Cited

U.S. PATENT DOCUMENTS 5,628,823  5/1997  Chandrasekhar et al. .

FOREIGN PATENT DOCUMENTS

| 0671491A1 | 9/1995 | (EP) . | |
|---|---|---|---|
| 5-139880 | 11/1991 | (JP) | C30B/15/36 |
| 09255485 | 9/1997 | (JP) | C30B/15/36 |
| WO 99/07922 | 2/1999 | (WO) . | |

OTHER PUBLICATIONS

European Search Report dated Aug. 19, 1999 for application No. 99302272.2–2104.

Primary Examiner—Felisa Hiteshew
(74) Attorney, Agent, or Firm—Hogan & Hartson, LLP

(57) ABSTRACT

In a method for producing a silicon single crystal, a silicon seed crystal having a sharp tip end is prepared, and a part of the silicon seed crystal is melted down from a tip end to a position having a predetermined thickness. This is followed by performing a necking operation to form a tapered necking part and a neck portion, and by subsequently pulling a single crystal ingot after increasing a diameter. The part to be melted down is a part from a tip end to a position in which a thickness is 1.1 to 2 times the diameter of the neck portion to be formed. The necking operation is then performed in such a way that a tapered necking part in the shape of a cone is formed at an early stage thereof by pulling a crystal with gradually decreasing a diameter to a minimum diameter of 5 mm or more, then forming a neck portion. Subsequently, the single crystal ingot is pulled after being increased in diameter. Methods according to the invention enable growing of a single crystal ingot without lowering the rate of success in making the crystal dislocation-free in cases where a thick neck is formed. This improves productivity of heavy silicon single crystals having a large diameter.

4 Claims, 1 Drawing Sheet

METHOD FOR PRODUCING SILICON SINGLE CRYSTAL

BACKGROUND OF THE INVENTION

1. Field of the Invention

The present invention relates to a method for producing a silicon single crystal by Czochralski method (CZ method) comprising using a silicon seed crystal (hereinafter occasionally referred to as seed crystal), performing a necking operation, and growing a silicon single crystal ingot.

2. Description of the Related Art

In a conventional method of manufacturing a silicon single crystal according to CZ method, a seed crystal which is a silicon single crystal is brought into contact with silicon melt and is then slowly pulled while being rotated to grow a silicon single crystal ingot. In the method, in order to eliminate dislocation caused by propagation of slip dislocation generated in the seed crystal in high density due to thermal shock, a neck portion having a smaller diameter as approximately 3 mm is formed after the silicon seed crystal is brought into contact with a silicon melt, namely so called necking operation is performed. Subsequently, the diameter of the crystal is increased to be a predetermined value, and then a dislocation-free silicon single crystal can be pulled. The above-mentioned necking operation is well known as Dash Necking method, which is a common method for pulling a silicon single crystal ingot according to CZ method.

The seed crystal conventionally used is in a cylindrical shape having a diameter of approximately 8 to 20 mm or a prismatic shape having a side length of approximately 8 to 20 mm, wherein a cut-away portion or notch is formed thereon for attachment to a seed crystal holder, and a shape of a lower end thereof to be brought into contact with a silicon melt first is flat. To pull a heavy single crystal ingot safely, thickness of the seed crystal cannot be smaller than the above value in light of strength of the material.

In the seed crystal having such a shape, slip dislocation generates in high density, since a heat capacity of the lower end which is brought into contact with a silicon melt is large, a temperature difference generates rapidly in the crystal as soon as the seed crystal is brought into contact with the silicon melt, resulting in generation of dislocation in high density. Accordingly, the above-mentioned necking operation is necessary to eliminate slip dislocation in the single crystal.

However, in the above mentioned method, a minimum diameter of the neck portion has to be decreased to approximately 3 to 5 mm in order to eliminate the dislocation, even when the necking condition is chosen appropriately. Such a small diameter is insufficient in strength to support a single crystal ingot such as manufactured in recent years, which has been getting heavier with increase of a diameter thereof. This may lead to a serious accident such that the fine neck portion is broken while the single crystal ingot is pulled, and the single crystal ingot falls.

To solve the above-mentioned problems, the applicant proposed inventions as disclosed in Japanese Patent Application Laid-open (kokai) No. 5-139880 and No.9-255485 (Japanese Patent Application No. 8-87187). In these inventions, a seed crystal having a wedge or hollow lower end is used to reduce as much slip dislocation which is generated when the seed crystal is brought into contact with a silicon melt as possible, so that dislocation can be eliminated even when the neck portion is relatively thick, and thereby the strength of the neck portion can be improved.

According to the method, strength of the neck portion can be improved to some extent, since the neck portion can be formed to be thick. However, even in the method, a necking operation is performed and a neck portion in which slip dislocation is present is formed. Furthermore, the neck portion has to be thicker for manufacture of an ingot which is larger in a diameter and longer such as those manufactured in recent years. For example, the diameter of the neck portion has to be 5 mm at least in order to pull a single crystal ingot having a weight of 200 kg or more, otherwise the strength may be insufficient. Accordingly, these inventions cannot solve the problems fundamentally.

Another problem in the necking method using the seed crystal having the special shape of the tip end mentioned above relates to a rate of success in making a crystal dislocation free. When the elimination of dislocation results in failure in the above-mentioned method, the seed crystal has to be exchanged to perform the method again. Accordingly, improvement in the rate of success in making a crystal dislocation free is especially important in the method. Elimination of dislocation cannot be achieved with a thick neck. According to a conventional necking method, when a diameter of a neck is more than 6–7 mm, elimination of dislocation is hardly achieved.

The inventors studied the cause of lowering of the rate of success in making a crystal dislocation free, and found that control of the factors which have been controlled in the conventional methods, such as a shape of a seed crystal, a temperature maintaining time during which a seed crystal is held above a melt surface, a melting speed, or the like is not sufficient for improvement in the rate of success in making a crystal dislocation free and reproducibility.

SUMMARY OF THE INVENTION

The present invention has been accomplished to solve the above-mentioned previous problems. An object of the present invention is to provide a method of producing a silicon single crystal which enables growing of a single crystal ingot without lowering the rate of success in making a crystal dislocation free in the case of using a seeding method wherein a thick neck is formed, and thereby improve productivity of a heavy silicon single crystal having a large diameter.

To achieve the above mentioned object, the present invention provides a method for producing a silicon single crystal which comprises preparing a silicon seed crystal having a sharp tip end, and melting down a part of the silicon seed crystal from a tip end to a position having a predetermined thickness, followed by performing a necking operation to form a tapered necking part and a neck portion, and subsequently pulling a single crystal ingot after increasing a diameter, wherein said part to be melted down is a part from a tip end to a position in which a thickness is 1.1 to 2 times the diameter of the neck portion to be formed; said necking operation is then performed in such a way that a tapered necking part in the shape of a cone is formed at an early stage thereof by pulling a crystal with gradually decreasing a diameter to a minimum diameter of 5 mm or more, and then a neck portion is formed; and subsequently the single crystal ingot is pulled after being increased in a diameter.

As described above, it is not necessary to spend a long period to melt down the crystal in excess to a position in which a thickness is more than twice as thick as the neck portion, and therefore, possibility of generation of slip dislocation can be greatly lowered, when thermal shock is decreased as a result of using a silicon seed crystal having a sharp tip end, and melting down the lower part of the seed crystal than a position in which a thickness is 1.1 to 2 times the diameter of the neck portion to be formed, the necking operation is performed in such a way that a tapered necking part in the shape of a cone is formed at an early stage thereof by pulling the crystal with gradually decreasing the diameter to a minimum diameter of 5 mm or more, and then a neck portion is formed, and subsequently a single crystal ingot is pulled after being increased in a diameter. Moreover, a slip dislocation is reduced efficiently due to presence of the tapered necking part, even if slip dislocation generates, so that the rate of success in making a crystal dislocation free and reproducibility thereof is improved. In that case, high reproducibility of elimination of dislocation can be achieved even when the neck portion is thick. Accordingly, the method of the present invention can provide a neck portion having the desired diameter, and thus copes with the tendency of the single crystal ingot to be larger and heavier, and can achieve improvement in productivity and cost reduction.

Length of the above-mentioned neck portion is preferably 5 mm or more.

It has been found that when the length of the neck portion is 5 mm or more, slip dislocation can be surely eliminated even if the melting of the tip end of the seed crystal is conducted to the position where thickness is 1.1 to 2 times the diameter of the neck portion to be formed. When the length of the neck portion is less than 5 mm, slip dislocation cannot be eliminated in some cases, and the rate of success in making a crystal dislocation free is sometimes lowered. Accordingly the length of the neck portion is preferably 5 mm or more.

Preferably, the necking operation is initiated within 5 minutes after a part of the silicon seed crystal is melt down into the melt.

When the necking operation is initiated within 5 minutes after a part of the silicon seed crystal is melted down into the melt, slip dislocation hardly generates or is hardly increased after melting down so that the rate of success in making a crystal dislocation free can be further improved. When the seed crystal is held on the surface of the melt of high temperature for a period longer than 5 minutes, additional slip dislocation may generate, or slip dislocation may increase while the silicon seed crystal is held at high temperature even in the case that only a few slip dislocation has generated while the seed crystal is brought into contact with the melt.

In CZ method, aging is generally performed in order to stick the seed crystal to the melt after the seed crystal is brought into contact with the melt, or dissolved therein. In the method of the present invention, the rate of success in making a crystal dislocation free can be improved by shortening the time therefor.

According to the present invention, the part to be melted down is a part from a tip end to a position in which a thickness is 1.1 to 2 times the diameter of the neck portion to be formed, so that possibility of generation of slip dislocation is decreased, time for melting is shortened. Furthermore, the rate of success in making a crystal dislocation free is significantly improved, since necking process can be conducted immediately after melting process.

As described above, according to the present invention, the rate of success in making a crystal dislocation free of approximately 90% or more can be achieved, good reproducibility and long stability can also be enabled, when the seeding method of thick necking is performed in the method of pulling a silicon single crystal ingot by Czochralski method. Accordingly, the method of the present invention can cope with the future tendency of the single crystal ingot to be of a larger diameter, and longer and heavier, and can achieve improvement in productivity, yield and cost reduction.

DESCRIPTION OF THE INVENTION AND EMOBDIMENT

The present invention and embodiments thereof will now be described. However, the invention is not limited thereto.

Figure 1:
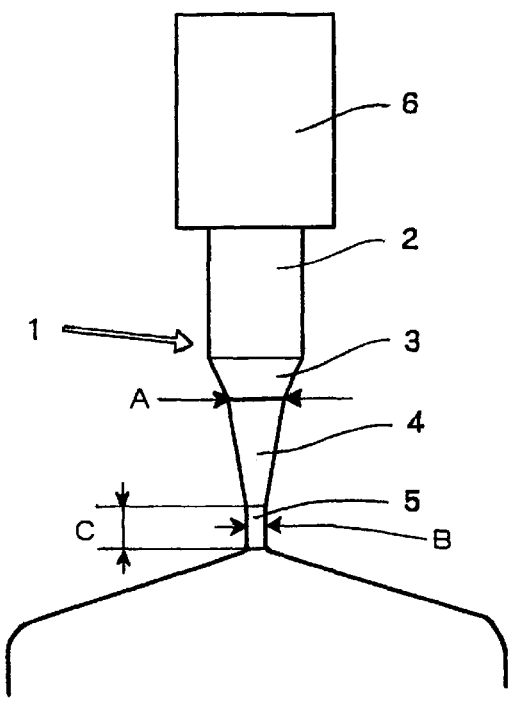
FIG. 1 is an explanatory view showing a method of the present invention wherein a thick neck portion is formed.

FIG. 1 is explanatory view showing a method of the present invention wherein a thick neck portion is formed.

The inventors of the present invention have studied a cause of failing in achieving sufficient rate of success in making a crystal dislocation free and reproducibility, when a necking operation is performed in the method of growing a silicon single crystal ingot, especially when a thick neck portion is formed, and have found that the cause of generation of the slip dislocation is closely related to a diameter of a lowest part of a seed crystal after a tip end of the seed crystal is melted, a diameter of a neck portion, length of a neck portion, a period after melting down of the seed crystal before a necking operation is initiated (holding time) or the like, and further studied these conditions to complete the present invention.

First, the inventors picked up the factors in the case of forming a thick neck which have been controlled in conventional methods, made experiments for the factors repeatedly, and defined a condition for elimination of dislocation as described below. The following factors, which are also shown in Table 1, were studied: a diameter of the lower end of the seed crystal after the tip end is melted (A), a holding time after melting down of the seed crystal before a necking operation is initiated (a), a diameter of a neck portion (B) and length of a neck portion (C).

The tip end 3 of the silicon seed crystal 1 of which body 2 is in a prismatic shape with side length of 14 mm was tapered to be a conical shape having vertical angle of 20°, and the surface of the silicon seed crystal was treated with a mixed acid to be etched to a depth of approximately 400 $\mu$m. The resultant silicon seed crystal 1 was fitted into a seed crystal holder 6, and a single crystal ingot having a diameter of 150 mm (6 inches) was grown. The rate of success in making a crystal dislocation free was examined for the resultant single crystal ingot.

The seed crystal was brought into contact with the melt as follows. First, after being kept at the position of 5 mm above the silicon melt for five minutes, the above mentioned silicon seed crystal 1 was lowered at a rate of 2.0 mm/min, the part having a certain length from the lower end of the seed crystal was dipped in the melt, and the tip end was melted until the diameter of the end of the seed crystal 3 after melting became (A) mm (2B>A$\geq$1.1B). After the silicon seed crystal 1 was kept at the position for (a) minutes, necking was initiated, and continued in such way that a tapered necking part 4 having a inverted cone like shape was formed until the diameter of the part became the predetermined value (B). Then, the neck portion 5 in a cylindrical shape having the length of C was formed, and subsequently a crystal was pulled with being increased in a diameter. Finally, the single crystal silicon ingot was pulled at a predetermined pulling rate.

The rate of success in making a crystal dislocation free during growing of the silicon single crystal thus manufactured is shown in Table 1. The term "the rate of success in making a crystal dislocation free" (%) (hereinafter occasionally referred to as DF rate) means percentage of the number of the single crystal ingot having no slip dislocation to the total number of the pulled single crystal ingots.

within 5 minutes after melting down, almost no slip dislocation newly generates, and slip dislocation is hardly increased, so that the rate of success in making a crystal dislocation free can be further improved. If the holding time at the surface of the melt having high temperature is more than five minutes, slip dislocation newly generates. If the seed crystal having slip dislocation is kept under high temperature, slip dislocation increases.

(3) The dislocation can be eliminated by growing the neck portion to have the length C of 5 mm or more in the necking process (comparing the results of Test Nos. 1,2,4).

TABLE 1

| Test No. | Shape of the seed crystal, side length of body (mm) | Diameter after melting down A (mm) | Holding time after Melting down a (min) | Diameter of neck Portion B (mm) | Length of neck portion C (mm) | Success rate (DF rate) (%) |
|---|---|---|---|---|---|---|
| 1 | Quadrangular Rod with conical tip end, 14 | 6.6 | 5 | 6.0 | 5 | 95 |
| 2 | Quadrangular Rod with conical tip end, 14 | 6.6 | 5 | 6.0 | 2 | 50 |
| 3 | Quadrangular Rod with conical tip end, 14 | 6.6 | 10 | 6.0 | 5 | 45 |
| 4 | Quadrangular Rod with conical tip end, 14 | 6.6 | 5 | 6.0 | 20 | 95 |
| 5 | Quadrangular Rod with conical tip end, 14 | 6.0 | 5 | 6.0 | 5 | 55 |
| 6 | Quadrangular Rod with conical tip end, 14 | 11.8 | 5 | 6.0 | 5 | 95 |
| 7 | Column, 6.6 | 6.6 | 5 | 6.0 | 5 | 20 |

As shown in Table 1, the relation between the factors A to C, (a) and the rate of success in making a crystal dislocation free is clear as follows.

(1) The diameter of the lower end of the seed crystal 3 after melting (A) has to be 1.1 to 2 times the diameter of the neck portion (B) (comparing the results of Test Nos. 1, 5, 6). Because, a tapered necking part has to be formed at an early stage by pulling the crystal with gradually decreasing the diameter in order to eliminate slip dislocation completely in the necking operation after melting down. If the neck portion in cylindrical shape having the same diameter as that after melting is formed without forming the tapered necking part, slip dislocation is hardly reduced, as confirmed also in other experiments.

(2) In the process that the tip end of the silicon seed crystal 3 is melted down into a melt, it is preferable that a holding time (a) after melting down of the seed crystal is 5 minutes or less and the necking operation is initiated immediately after the holding (comparing the results of Test Nos. 1 and 3).

When the tip end of the seed crystal is melted at a temperature suitable for necking, and necking is initiated However, the length of 50 mm or less is practical. If the length is longer than 50 mm, it takes long time to perform the necking operation, and therefore productivity is lowered.

Figure 2:
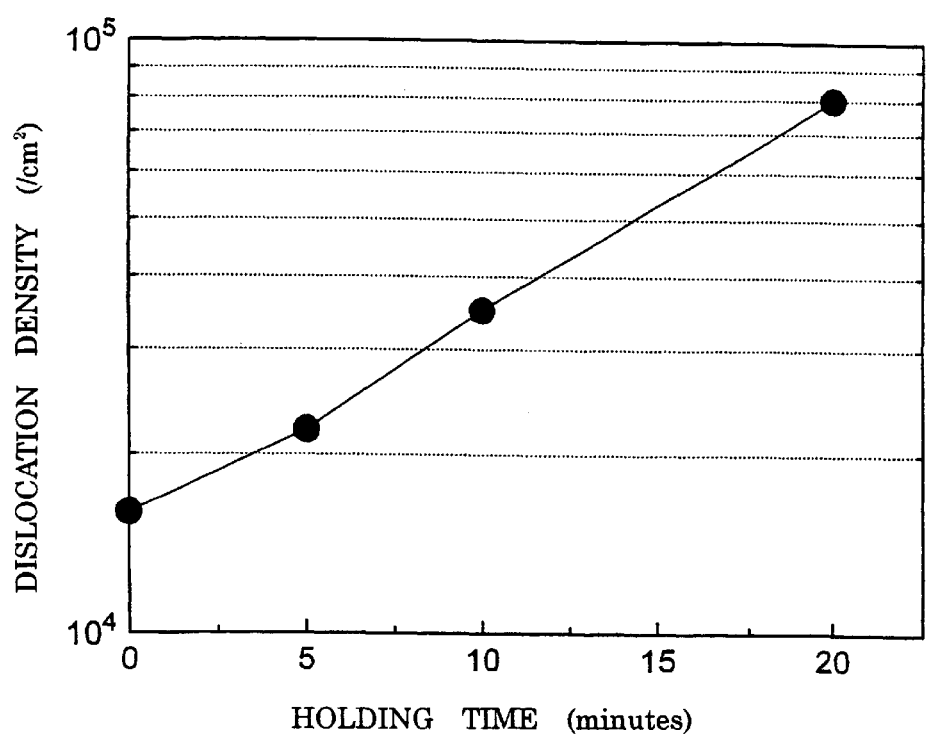
FIG. 2 is a graph showing a relation between holding time after melting down of the seed crystal and slip dislocation density.

FIG. 2 shows the result of the experiment examining the relation between a holding time after melting down of the seed crystal and a slip dislocation density.

The term "dislocation density" as used herein means a pit density observed in the center of the section of the seed crystal, which is obtained by cutting the seed crystal along the surface parallel to the axial direction of crystal growing, and performing preferential etching. The pit density interrelates to the number of generation of slip dislocation.

As shown in FIG. 2, longer holding time results in higher dislocation density. When dislocation density increases, slip dislocation is hardly eliminated in the subsequent necking process.

Test No. 7 in Table 1 is a comparative example, in which a necking operation was performed in the same manner as Test No. 1 except that there was used a seed crystal in a cylindrical shape having a diameter of 6.6 mm of which tip end is flat. When the seed crystal having no sharp tip end is used and the neck is formed to be thick, the rate of success in making a crystal dislocation free is extremely lowered.

As described above, in the method of the present invention wherein a seed crystal having a sharp tip end is used, and the neck portion having a diameter of 5 mm or more is formed, three factors: namely, the thickness of the lower end of the seed crystal after melting the tip end (A) of 1.1 to 2 times the diameter of the neck portion (B); the length of the neck portion C of 5 mm or more; and a holding time (a) after melting down closely relate to the rate of success in making a crystal dislocation free. By controlling the factors in an appropriate range, slip dislocation can be surely eliminated in the necking process, and slip dislocation hardly generates in the pulled crystal so that high rate of success in making a crystal dislocation free can be achieved with high reproducibility. The present invention is especially advantageous for growing the single crystal ingot having a large diameter and high weight, and therefore, productivity and yield of the single crystal ingot can be improved, and cost reduction can be achieved.

The seed crystal used for the necking method according to the present invention is preferably the seed crystal conventionally used for dislocation free seeding wherein an end to be brought into contact with a silicon melt is a sharp tip end in the shape of a cone or a pyramid or a truncation thereof, and a body is in a shape of a cylinder (column) or a prism. Accordingly, the term "a seed crystal having a sharp tip" as used herein includes these seed crystals.

When there is used the silicon seed crystal in a cylindrical shape having diameter of 14 mm or more, a prismatic shape having a side length of 14 mm or more, or a polygonal rod shape wherein a diameter of the inscribed circle in section is 14 mm or more as a thickness of the body of the seed crystal, the tapered necking part sufficient for eliminating slip dislocation can be formed between the seed crystal and the neck portion even if the diameter of the neck portion is thick as 5 mm or more, and strength of the seed crystal itself is also sufficient. Accordingly, the method can cope with the tendency of the single crystal ingot to be larger and heavier.

The tip end of these seed crystals preferably have a vertical angle of 28° or less, thereby a thermal stress can be relaxed on seeding, resulting in significant reduction or elimination of generation of slip dislocation. Moreover, increase of slip dislocation can be surely prevented also on melting down of the seed crystal, since the diameter thereof changes gradually.

The present invention is not limited to the above-described embodiment. The above-described embodiment is a mere example, and those having the substantially same structure as that described in the appended claims and providing the similar action and effects are included in the scope of the present invention.

For example, in the above-described embodiment, the silicon single crystal ingot having a diameter of 150 mm (6 inches) was grown. However, the method of the present invention can sufficiently cope with a silicon single crystal ingot having further larger diameter as from 200 mm (8 inches) to 400 mm (16 inches) or more which has been used in recent years.

Moreover, the method of the present invention can be applied not only for a Czochralski method but also for MCZ method (Magnetic field applied Czochralski crystal growth method) in which magnetic field is applied when the silicon single crystal is pulled. Namely, the term "a Czochralski method" includes not only general Czochralski method but also MCZ method.

What is claimed is:

1. A method for producing a silicon single crystal which comprises preparing a silicon seed crystal having a sharp tip end, and melting down a part of the silicon seed crystal from a tip end to a position having a thickness, followed by performing a necking operation to form a tapered necking part and a neck portion, and subsequently pulling a single crystal ingot after increasing a diameter, wherein said part to be melted down is a part from a tip end to a position in which a thickness is 1.1 to 2 times the diameter of the neck portion to be formed; said necking operation is then performed in such a way that a tapered necking part in the shape of a cone is formed at an early stage thereof by pulling a crystal with gradually decreasing a diameter to a minimum diameter of 5 mm or more, and then a neck portion is formed; and subsequently the single crystal ingot is pulled after being increased in a diameter.

2. The method according to claim 1 wherein the length of said neck portion is 5 mm or more.

3. The method according to claim 2 wherein said necking is initiated within 5 minutes after the part of the silicon seed crystal is melt down into the melt.

4. The method according to claim 1 wherein said necking is initiated within 5 minutes after the part of the silicon seed crystal is melt down into the melt.

* * * * *